US009490824B1

United States Patent
Singh et al.

(10) Patent No.: US 9,490,824 B1
(45) Date of Patent: Nov. 8, 2016

(54) PHASE-LOCKED LOOP WITH FREQUENCY BOUNDING CIRCUIT

(71) Applicant: FREESCALE SEMICONDUCTOR, INC., Austin, TX (US)

(72) Inventors: Devesh P. Singh, Bijnor (IN); Firas N. Abughazaleh, Austin, TX (US); Anand Kumar Sinha, Noida (IN); Sanjay K. Wadhwa, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 15/000,911

(22) Filed: Jan. 19, 2016

(51) Int. Cl.
 *H03L 7/06* (2006.01)
 *H03L 7/089* (2006.01)
 *H03L 7/099* (2006.01)

(52) U.S. Cl.
 CPC ............. *H03L 7/0891* (2013.01); *H03L 7/099* (2013.01)

(58) Field of Classification Search
 USPC .............. 327/2–12, 105–123, 141, 144–163; 331/1 A, 15–17; 375/373–376
 See application file for complete search history.

(56) References Cited

U.S. PATENT DOCUMENTS

| | | | |
|---|---|---|---|
| 5,142,247 A | 8/1992 | Lada, Jr. et al. | |
| 5,208,555 A * | 5/1993 | Graham ................ | H03L 7/0891 331/1 A |
| 5,317,285 A | 5/1994 | Chan | |
| 6,853,254 B2 * | 2/2005 | Li ............................ | H03L 7/18 331/16 |
| 7,123,065 B1 * | 10/2006 | Moyal .................... | H03L 7/0891 327/156 |
| 7,310,009 B2 | 12/2007 | Oh | |
| 7,330,078 B1 | 2/2008 | Li et al. | |
| 7,539,473 B2 | 5/2009 | Cranford, Jr. et al. | |
| 7,898,305 B2 | 3/2011 | Okamoto et al. | |
| 8,890,593 B1 * | 11/2014 | Kim ...................... | H03L 7/0816 327/149 |

* cited by examiner

*Primary Examiner* — Brandon S Cole
(74) *Attorney, Agent, or Firm* — Charles E. Bergere

(57) ABSTRACT

A phase-locked loop (PLL) for generating an oscillating signal includes a frequency bounding circuit. When a frequency of the oscillating signal is greater than a first threshold value, which is greater than a maximum normal operational frequency of the PLL, the frequency bounding circuit forces a charge pump to discharge a loop filter until the oscillating signal frequency is less than a second threshold value that is within the normal operational frequency range of the PLL. When the frequency of the oscillating signal is less than a third threshold value, which is less than a minimum normal operational frequency of the PLL, the frequency bounding circuit forces the charge pump to charge the loop filter until the oscillating signal frequency is greater than a fourth threshold value that is within the normal operational frequency range of the PLL.

17 Claims, 7 Drawing Sheets

PHASE-LOCKED LOOP WITH FREQUENCY BOUNDING CIRCUIT

BACKGROUND

The present invention relates generally to integrated circuits, and, more particularly, to a phase-locked loop.

Phase-locked loops (PLLs) are used in electronic devices such as radios, telecommunication systems, computers, and so forth. Using a reference clock signal, a PLL generates an oscillating signal, which is used to synchronize the operations of components of an integrated circuit.

Typically, a PLL includes a phase-frequency detector (PFD), a charge pump, a loop filter, a voltage-controlled oscillator (VCO), and a loop divider. To generate an oscillating signal, the PFD determines the phase difference between the reference clock signal and a feedback signal and generates up and down signals. The charge pump generates a charge pump output current that varies based on the up and down signals. The loop filter outputs a control voltage, based on the charge pump output current, to the VCO, which generates the oscillating signal and varies the frequency of the oscillating signal based on the value of the control voltage. The feedback signal is a frequency-divided version of the oscillating signal, which is provided by the loop divider. In PLLs that do not include a loop divider, the PFD receives the oscillating signal as the feedback signal.

Noise from various components of the PLL or electrical noise from the environment can affect the control voltage, which may cause the frequency of the oscillating signal to overshoot or undershoot. Overshoot may result in the oscillating signal frequency being greater than a maximum normal operational frequency of the loop divider, which may cause the loop divider to malfunction. Thus, the PFD may receive an incorrect feedback signal, which causes the PFD to continuously activate the up signal, leading to continuous charging of the loop filter, and hence, an increase in the control voltage. This in turn further increases the frequency of the oscillating signal and the PLL enters a deadlock condition. In an adaptive bandwidth PLL, undershoot increases the time required to achieve a phase lock between the oscillating signal and the reference clock signal (also known as 'the PLL lock time'), since the charge pump output current is proportional to the control voltage. Further, during start-up, as the control voltage is at zero, the time required to charge the loop filter to a desired voltage is large. In PLLs that do not include a loop divider, overshoot in the oscillating signal frequency may result in the oscillating signal frequency being greater than the maximum normal operational frequency of the PFD, thereby causing the PFD to malfunction.

A known technique to overcome the aforementioned problems is to use a frequency bounding circuit, which controls the charge pump to vary the charge pump output current during overshoot and undershoot conditions based on a comparison of the control voltage with a fixed threshold voltage until normal PLL operation is restored. However, the control voltage can vary significantly with process-voltage-temperature (PVT) variations, which results in a large variation in frequency threshold values.

Another known technique is to reset the PLL when an overshoot occurs. However, this increases the time required to re-lock the oscillating signal to the reference clock signal. Further, this technique does not provide a solution for the undershoot condition and also does not reduce the start-up time of an adaptive bandwidth PLL.

It would be advantageous to have a PLL that controls the oscillating signal frequency during undershoot and overshoot conditions, and reduces the time required to re-lock the oscillating signal to the reference clock signal during the undershoot condition as well as the start-up time of the PLL.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
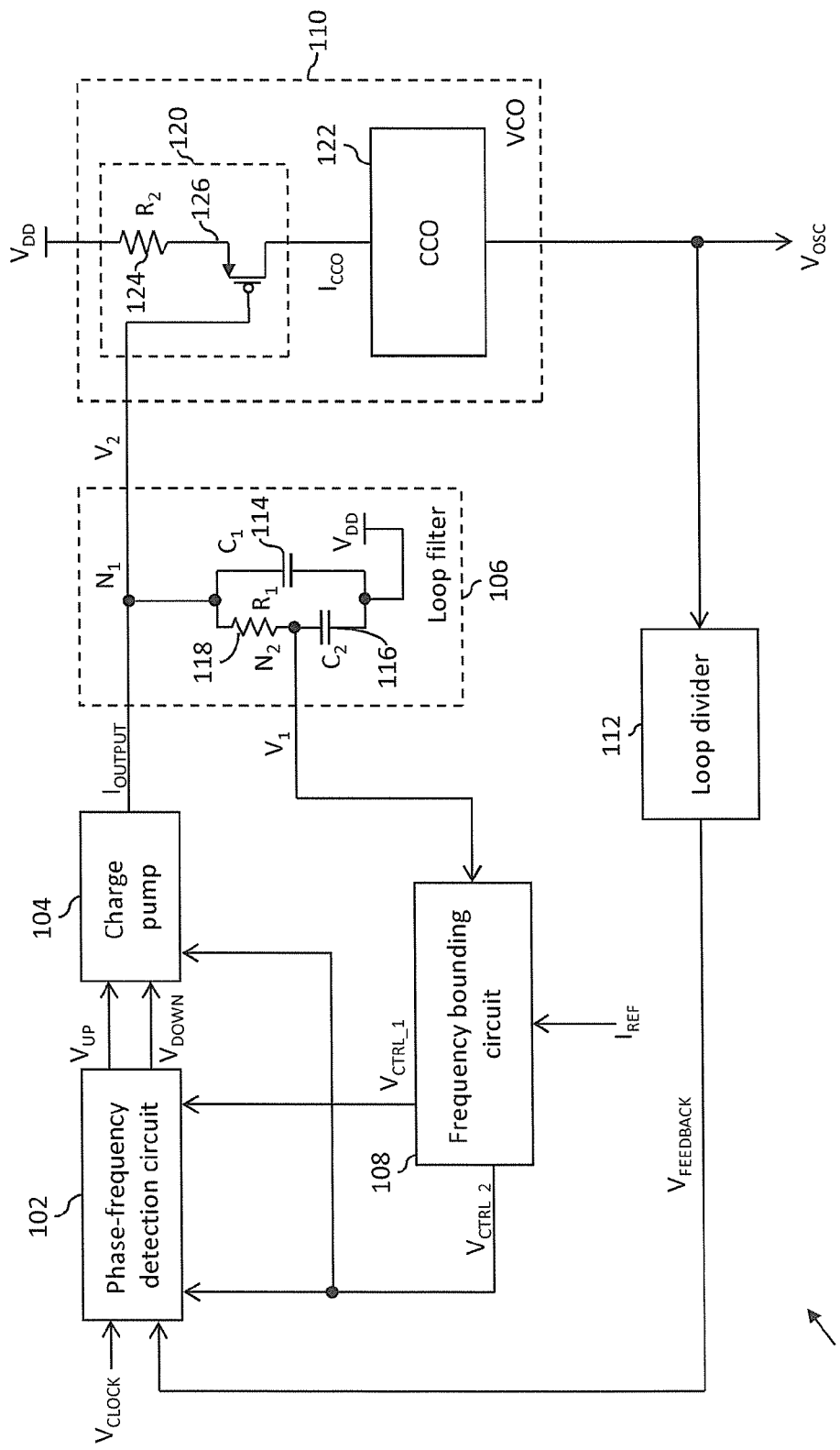
FIG. 1 is a schematic block diagram of a PLL in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a phase-locked loop (PLL) is provided. The PLL includes a phase-frequency detection circuit, a charge pump, a loop filter, a frequency bounding circuit, and a voltage-controlled oscillator (VCO). The phase-frequency detection circuit receives a clock signal, a feedback signal, and first and second control signals, and generates up and down signals. The feedback signal is at least one of an oscillating signal and a frequency-divided version of the oscillating signal. The phase-frequency detection circuit activates the down signal when the first control signal is active and activates the up signal when the second control signal is active. The charge pump receives the up and down signals and generates a charge pump output current. The loop filter receives the charge pump output current and generates first and second voltages. The frequency bounding circuit receives a reference current and the first voltage and generates the first and second control signals. The frequency bounding circuit activates the first control signal when the first voltage is less than a first threshold voltage, deactivates the first control signal when the first voltage is greater than a second threshold voltage, activates the second control signal when the first voltage is greater than a third threshold voltage, and deactivates the second control signal when the first voltage is less than a fourth threshold voltage. The VCO receives the second voltage and generates the oscillating signal.

In another embodiment of the present invention, a PLL is provided. The PLL includes a phase-frequency detection circuit, a charge pump, a loop filter, a frequency bounding circuit, and a VCO. The frequency bounding circuit includes a current mirror, first and second reference voltage generators, and first and second comparators. The phase-frequency detection circuit receives a reference clock signal, a feedback signal, and first and second control signals, and generates up and down signals. The phase-frequency detection circuit continuously activates the down signal when the first control signal is active and continuously activates the up signal when the second control signal is active. The charge pump receives the up and down signals and generates a charge pump output current. The loop filter receives the charge pump output current and generates first and second voltages. The current mirror receives a reference current and outputs first through fourth sink currents. The first reference voltage generator receives the first sink current and the second sink current by way of a first switch and generates a first reference voltage. The first reference voltage generator provides a first threshold voltage as the first reference voltage when the first control signal is inactive and provides a second threshold voltage as the first reference voltage when the first control signal is active. The first switch is controlled by the first control signal and is in an open position when the first control signal is active. The second reference voltage generator receives the third sink current and the fourth sink current by way of a second switch and generates a second reference voltage. The second reference voltage generator provides a third threshold voltage as the second reference voltage when the second control signal is inactive and provides a fourth threshold voltage as the second reference voltage when the second control signal is active. The second switch is controlled by the second control signal and is in a closed position when the second control signal is active. The first comparator compares the first voltage with the first reference voltage and generates the first control signal. The first comparator activates the first control signal when the first voltage is less than the first threshold voltage and deactivates the first control signal when the first voltage is greater than the second threshold voltage. The second comparator compares the first voltage with the second reference voltage and generates the second control signal. The second comparator activates the second control signal when the first voltage is greater than the third threshold voltage, and deactivates the second control signal when the first voltage is less than the fourth threshold voltage. The VCO receives the second voltage and generates the oscillating signal.

In yet another embodiment, the present invention provides a method for controlling a frequency of an output oscillating signal of a PLL. The method comprises receiving a clock signal and determining a phase difference between the clock signal and a feedback signal. The feedback signal is at least one of the output oscillating signal and a frequency-divided version of the output oscillating signal. The method further comprises generating up and down signals based on at least one of the phase difference between the clock signal and the feedback signal, a value of the first control signal, and a value of the second control signal. The down signal is active when the first control signal is active, and the up signal is active when the second control signal is active. The method further comprises generating a charge pump output current based on the up and down signals for charging and discharging a loop filter. The method further comprises modulating the charge pump output current for controlling the frequency of the output oscillating signal. The modulating step comprises activating the first control signal when an output voltage of the loop filter is less than a first threshold voltage, deactivating the first control signal when the output voltage of the loop filter is greater than a second threshold voltage, activating the second control signal when the output voltage of the loop filter is greater than a third threshold voltage, and deactivating the second control signal when the output voltage of the loop filter is less than a fourth threshold voltage.

Various embodiments of the present invention provide a PLL for generating an oscillating signal. The PLL includes a phase-frequency detection circuit, a charge pump, a loop filter, a frequency bounding circuit, and a VCO. The phase-frequency detection circuit receives the oscillating signal, a feedback signal, and first and second control signals, and generates up and down signals. The feedback signal is at least one of the oscillating signal and a frequency-divided version of the oscillating signal. The charge pump receives the up and down signals and generates a charge pump output current. The loop filter receives the charge pump output current and generates first and second voltages. The first voltage is a filtered version of the second voltage. The frequency bounding circuit receives the first voltage and a reference current and generates reference voltages based on the reference current. The frequency bounding circuit generates first and second control signals based on a comparison of the first voltage with the reference voltages. The VCO receives the second voltage and generates the oscillating signal.

When the frequency of the oscillating signal is greater than a first threshold frequency, which is greater than the maximum normal operational frequency of the PLL, the frequency bounding circuit forces the charge pump to activate the down signal, which results in discharging of the loop filter until the frequency of the oscillating signal is less than a second threshold frequency, which lies within the normal operational frequency range of the PLL. When the frequency of the oscillating signal is less than a third threshold frequency, which is less than the minimum normal operational frequency of the PLL, the frequency bounding circuit forces the charge pump to activate the up signal, which results in charging of the loop filter until the frequency of the oscillating signal is greater than a fourth threshold frequency, which lies within the normal operational frequency range of the PLL. Thus, the difference between the first and second threshold frequencies is the hysteresis value for an overshoot condition, and the difference between the fourth and third threshold frequencies is the hysteresis value for an undershoot condition.

The frequency bounding circuit replicates the reference current to generate the reference voltages for comparison with the first voltage. This ensures less variation across pressure-voltage-temperature (PVT) corners as compared to comparing the first voltage directly with a fixed threshold voltage. Further, the first voltage, which is the filtered version of the second voltage, is used for comparison with the reference voltages instead of the second voltage. This prevents spurious switching of the frequency bounding circuit, since the second voltage has more ripples compared to the first voltage.

Referring now to FIG. 1, a schematic block diagram of a phase-locked loop (PLL) 100 in accordance with an embodiment of the present invention is shown. The PLL 100 includes a phase-frequency detection circuit 102, a charge pump 104, a loop filter 106, a frequency bounding circuit 108, a voltage-controlled oscillator (VCO) 110, and a loop divider 112.

The PFD 102 is connected to the frequency bounding circuit 108 to receive first and second control signals ($V_{CTRL\_1}$ and $V_{CTRL\_2}$) and the loop divider 112 to receive a feedback signal ($V_{FEEDBACK}$). The PFD 102 also receives a clock signal ($V_{CLOCK}$) and generates up and down signals ($V_{UP}$ and $V_{DOWN}$). The PFD 102 activates the down signal ($V_{DOWN}$) when the first control signal ($V_{CTRL\_1}$) is active and activates the up signal ($V_{UP}$) when the second control signal ($V_{CTRL\_2}$) is active.

The charge pump 104 is connected to the PFD 102 to receive the up and down signals ($V_{UP}$ and $V_{DOWN}$) and the frequency bounding circuit 108 to receive the second control signal ($V_{CTRL\_2}$), and generates a charge pump output current ($I_{OUTPUT}$).

The loop filter 106 is connected to the charge pump 104 to receive the charge pump output current ($I_{OUTPUT}$), and generates first and second voltages ($V_1$ and $V_2$). In one embodiment, the loop filter 106 includes first and second capacitors 114 and 116 and a first resistor 118.

The first capacitor 114 is connected between the charge pump 104 and a supply voltage ($V_{DD}$). The first resistor 118 and the second capacitor 116 are connected in series and form a low-pass filter. The series combination of the first resistor 118 and the second capacitor 116 is connected in parallel with the first capacitor 114. The second voltage ($V_2$) is output from a first node $N_1$ between the charge pump 104 and the first capacitor 114, and the first voltage ($V_1$) is output from a second node $N_2$ between the first resistor 118 and the second capacitor 116. Thus, the first voltage ($V_1$) is a filtered version of the second voltage ($V_2$). As the loop filter 106 is connected to the supply voltage ($V_{DD}$) instead of ground, the first and second nodes $N_1$ and $N_2$ are charged by the charge pump 104 (i.e., the first and second voltages ($V_1$ and $V_2$) increase) when the down signal ($V_{DOWN}$) is active, leading to discharging of the first and second capacitors 114 and 116, and hence the loop filter 106. The first and second nodes $N_1$ and $N_2$ are discharged by the charge pump 104 (i.e., the first and second voltages ($V_1$ and $V_2$) decrease) when the up signal ($V_{UP}$) is active, leading to charging of the first and second capacitors 114 and 116, and hence the loop filter 106.

The frequency bounding circuit 108 is connected to the loop filter 106 to receive the first voltage ($V_1$). The frequency bounding circuit 108 also receives a reference current ($I_{REF}$) and generates the first and second control signals ($V_{CTRL\_1}$ and $V_{CTRL\_2}$).

The frequency bounding circuit 108 activates the first control signal ($V_{CTRL\_1}$) when the first voltage ($V_1$) is less than a first threshold voltage and deactivates the first control signal ($V_{CTRL\_1}$) when the first voltage ($V_1$) is greater than a second threshold voltage. The frequency bounding circuit 108 activates the second control signal ($V_{CTRL\_2}$) when the first voltage ($V_1$) is greater than a third threshold voltage and deactivates the second control signal ($V_{CTRL\_2}$) when the first voltage ($V_1$) is less than a fourth threshold voltage. The first through fourth threshold voltages correspond to first through fourth threshold frequencies of the oscillating signal ($V_{OSC}$), respectively.

The VCO 110 includes a voltage-to-current converter 120 and a current-controlled oscillator (CCO) 122. The voltage-to-current converter 120 is connected to the loop filter 106 to receive the second voltage ($V_2$) and generates a control current ($I_{CCO}$). The CCO 122 is connected to the voltage-to-current converter 120 to receive the control current ($I_{CCO}$) and generates the oscillating signal ($V_{OSC}$). In one example, the CCO 122 is a ring oscillator that includes an odd number of cascade-connected inverters (not shown).

In one embodiment, the voltage-to-current converter 120 includes a second resistor 124 and a first transistor 126, which is a p-channel metal-oxide semiconductor (PMOS) transistor. The first transistor 126 has a source connected to the supply voltage ($V_{DD}$) by way of the second resistor 124, a gate connected to the loop filter 106 to receive the second voltage ($V_2$), and a drain connected to the CCO 122 to provide the control current ($I_{CCO}$).

The loop divider 112 is connected to the VCO 110 to receive the oscillating signal ($V_{OSC}$) and generates the feedback signal ($V_{FEEDBACK}$).

Figure 2:
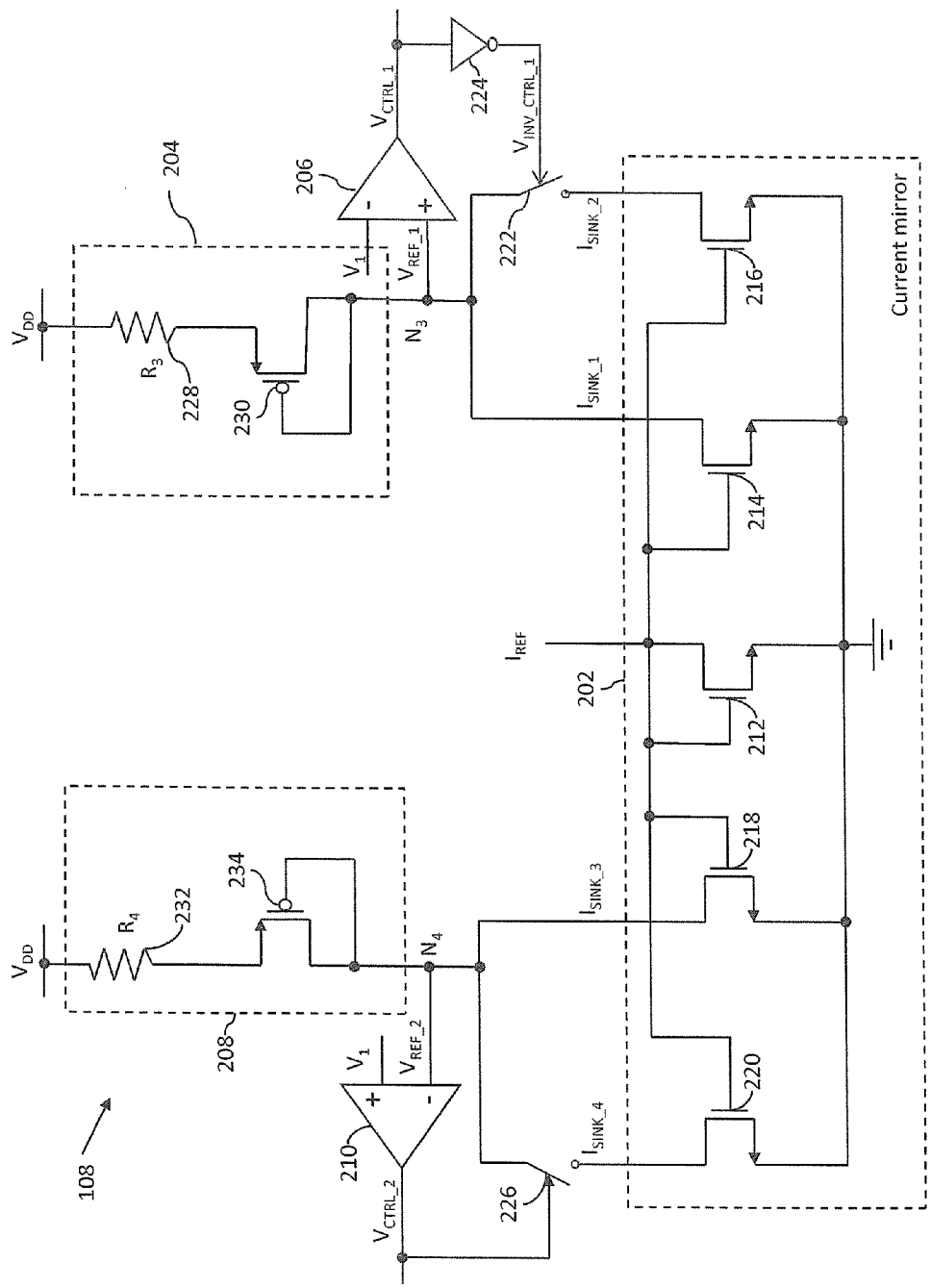
FIG. 2 is a schematic block diagram of a frequency bounding circuit of the PLL of FIG. 1 in accordance with an embodiment of the present invention.

Referring now to FIG. 2, a schematic block diagram of the frequency bounding circuit 108 in accordance with an embodiment of the present invention is shown. The frequency bounding circuit 108 includes a current mirror 202, a first reference voltage generator 204, a first comparator 206, a second reference voltage generator 208, and a second comparator 210.

The current mirror 202 has an input branch that receives the reference current ($I_{REF}$) and first through fourth output branches that output first through fourth sink currents ($I_{SINK\_1}$-$I_{SINK\_4}$), respectively. In one embodiment, the current mirror 202 includes second through sixth transistors 212-220. The second through sixth transistors 212-220 are n-channel metal-oxide semiconductor (NMOS) transistors.

The second transistor 212 has a source connected to ground, a drain that receives the reference current ($I_{REF}$), and a gate connected to its drain. Each of the third through sixth transistors 214-220 has its source connected to ground, and its gate connected to the gate of the second transistor 212. Drains of the third through sixth transistors 214-220 output the first through fourth sink currents ($I_{SINK\_1}$-$I_{SINK\_4}$), respectively.

The first reference voltage generator 204 is connected to the supply voltage ($V_{DD}$). The first reference voltage generator 204 is also connected to the drain of the third transistor 214 to receive the first sink current ($I_{SINK\_1}$) and to the drain of the fourth transistor 216 by way of a first switch 222 to receive the second sink current ($I_{SINK\_2}$). The first switch 222 is controlled by an inverted version of the first control signal ($V_{INV\_CTRL\_1}$), hereinafter referred to as inverted first control signal ($V_{INV\_CTRL\_1}$) which is received by way of a first inverter 224 and is in an open position when the first control signal ($V_{CTRL\_1}$) is active.

The first comparator 206 has a positive terminal connected to a third node $N_3$ to receive a first reference voltage ($V_{REF\_1}$), a negative terminal connected to the loop filter 106 to receive the first voltage ($V_1$) and an output terminal to generate the first control signal ($V_{CTRL\_1}$). The third node $N_3$ is formed by the interconnection of the first reference voltage generator 204, the first switch 222, and the drain of the third transistor 214.

Thus, the first comparator 206 receives the first threshold voltage as the first reference voltage ($V_{REF\_1}$) when the first switch 222 is in a closed position, and the second threshold voltage as the first reference voltage ($V_{REF\_1}$) when the first switch 222 is in the open position.

The second reference voltage generator 208 is connected to the supply voltage ($V_{DD}$). The second reference voltage generator 208 is also connected to the drain of the fifth transistor 218 to receive the third sink current ($I_{SINK\_3}$) and to the drain of the sixth transistor 220 by way of a second switch 226 to receive the fourth sink current ($I_{SINK\_4}$). The second switch 226 is controlled by the second control signal ($V_{CTRL\_2}$) and is in the closed position when the second control signal ($V_{CTRL\_2}$) is active.

The second comparator 210 has a negative terminal connected to a fourth node $N_4$ to receive a second reference voltage ($V_{REF\_2}$), a positive terminal connected to the loop filter 106 to receive the first voltage ($V_1$) and an output terminal to generate the second control signal ($V_{CTRL\_2}$). The fourth node $N_4$ is formed by the interconnection of the second reference voltage generator 208, the second switch 226, and the drain of the fifth transistor 218.

Thus, the second comparator 210 receives the third threshold voltage as the second reference voltage ($V_{REF\_2}$) when the second switch 226 is in the open position, and the fourth threshold voltage as the second reference voltage ($V_{REF\_2}$) when the second switch 226 is in the closed position.

The first and second reference voltage generators 204 and 208 are diode-connected replicas of the voltage-to-current converter 120. In the presently preferred embodiment, the first reference voltage generator 204 includes a seventh transistor 230 having a source connected to the supply voltage ($V_{DD}$) by way of a third resistor 228, a drain connected to the drain of the third transistor 214 and the drain of the fourth transistor 216 by way of the first switch 222, and a gate connected to its drain. The second reference voltage generator 208 includes an eighth transistor 234 having a source connected to the supply voltage ($V_{DD}$) by way of a fourth resistor 232, a drain connected to the drain of the fifth transistor 218 and the drain of the sixth transistor 220 by way of the second switch 226, and a gate connected to its drain.

Figure 3:
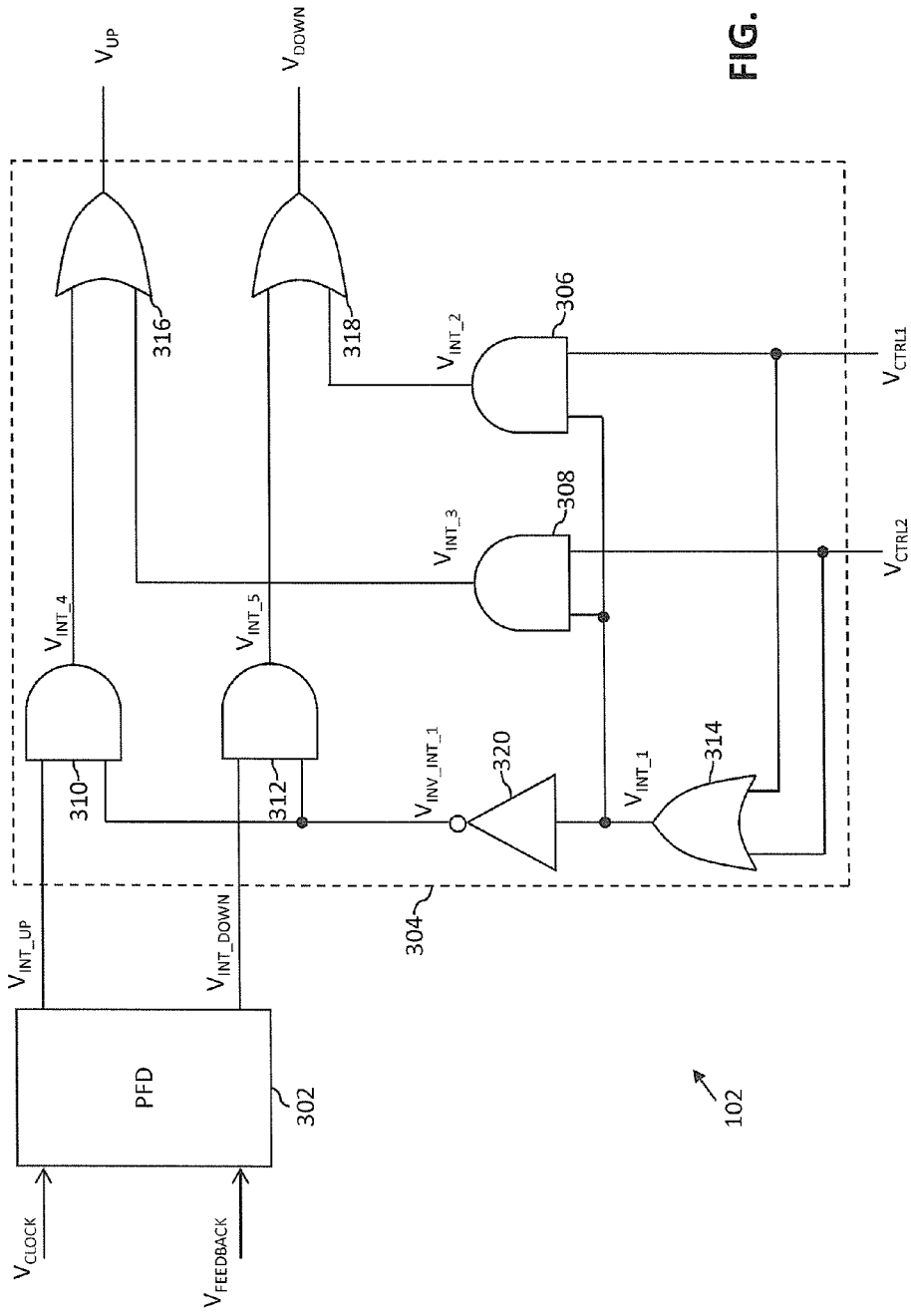
FIG. 3 is a schematic block diagram of a PFD circuit of the PLL of FIG. 1 in accordance with an embodiment of the present invention.

Referring now to FIG. 3, a schematic block diagram of the PFD 102 in accordance with an embodiment of the present invention is shown. The PFD 102 includes a phase-frequency detector (PFD) 302 and a logic circuit 304.

The PFD 302 receives the clock signal ($V_{CLOCK}$) and the feedback signal ($V_{FEEDBACK}$) and generates intermediate up and down signals ($V_{INT\_UP}$ and $V_{INT\_DOWN}$). The PFD 302 activates the intermediate up signal ($V_{INT\_UP}$) when the feedback signal ($V_{FEEDBACK}$) lags the clock signal ($V_{CLOCK}$), and activates the intermediate down signal ($V_{INT\_DOWN}$) when the feedback signal ($V_{FEEDBACK}$) leads the clock signal ($V_{CLOCK}$).

The logic circuit 304 is connected to the PFD 302 to receive the intermediate up and down signals ($V_{INT\_UP}$ and $V_{INT\_DOWN}$), the first comparator 206 to receive the first control signal ($V_{CTRL\_1}$) and the second comparator 210 to receive the second control signal ($V_{CTRL\_2}$). The logic circuit 304 outputs at least one of the intermediate up and second control signals ($V_{INT\_UP}$ and $V_{CTRL\_2}$) as the up signal ($V_{UP}$), and at least one of the intermediate down and first control signals ($V_{INT\_DOWN}$ and $V_{CTRL\_1}$) as the down signal ($V_{DOWN}$).

In one embodiment, the logic circuit 304 includes first through fourth AND gates 306-312, first through third OR gates 314-318, and a second inverter 320.

The first OR gate 314 is connected to the first and second comparators 206 and 210 to receive the first and second control signals ($V_{CTRL\_1}$ and $V_{CTRL\_2}$), respectively, and generates a first intermediate signal ($V_{INT\_1}$).

The first AND gate 306 is connected to the first comparator 206 and the first OR gate 314 to receive the first control signal ($V_{CTRL\_1}$) and the first intermediate signal ($V_{INT\_1}$), respectively, and generates a second intermediate signal ($V_{INT\_2}$).

The second AND gate 308 is connected to the second comparator 210 and the first OR gate 314 to receive the second control signal ($V_{CTRL\_2}$) and the first intermediate signal ($V_{INT\_1}$), respectively, and generates a third intermediate signal ($V_{INT\_3}$).

The third AND gate 310 is connected to the PFD 302 to receive the intermediate up signal ($V_{INT\_UP}$) and the first OR gate 314 (by way of the second inverter 320) to receive an inverted version of the first intermediate signal ($V_{INT\_INT\_1}$), hereinafter referred to as the inverted first intermediate signal ($V_{INT\_INT\_1}$), and generates a fourth intermediate signal ($V_{INT\_4}$).

The fourth AND gate 312 is connected to the PFD 302 to receive the intermediate down signal ($V_{INT\_DOWN}$) and the first OR gate 314 (by way of the second inverter 320) to receive the inverted first intermediate signal ($V_{INT\_INT\_1}$), respectively, and generates a fifth intermediate signal ($V_{INT\_5}$).

The second OR gate 316 is connected to the second and third AND gates 308 and 310 to receive the third and fourth intermediate signals ($V_{INT\_3}$ and $V_{INT\_4}$), respectively, and generates the up signal ($V_{UP}$).

The third OR gate 318 is connected to the first and fourth AND gates 306 and 312 to receive the second and fifth intermediate signals ($V_{INT\_2}$ and $V_{INT\_5}$), respectively, and generates the down signal ($V_{DOWN}$).

Figure 4:
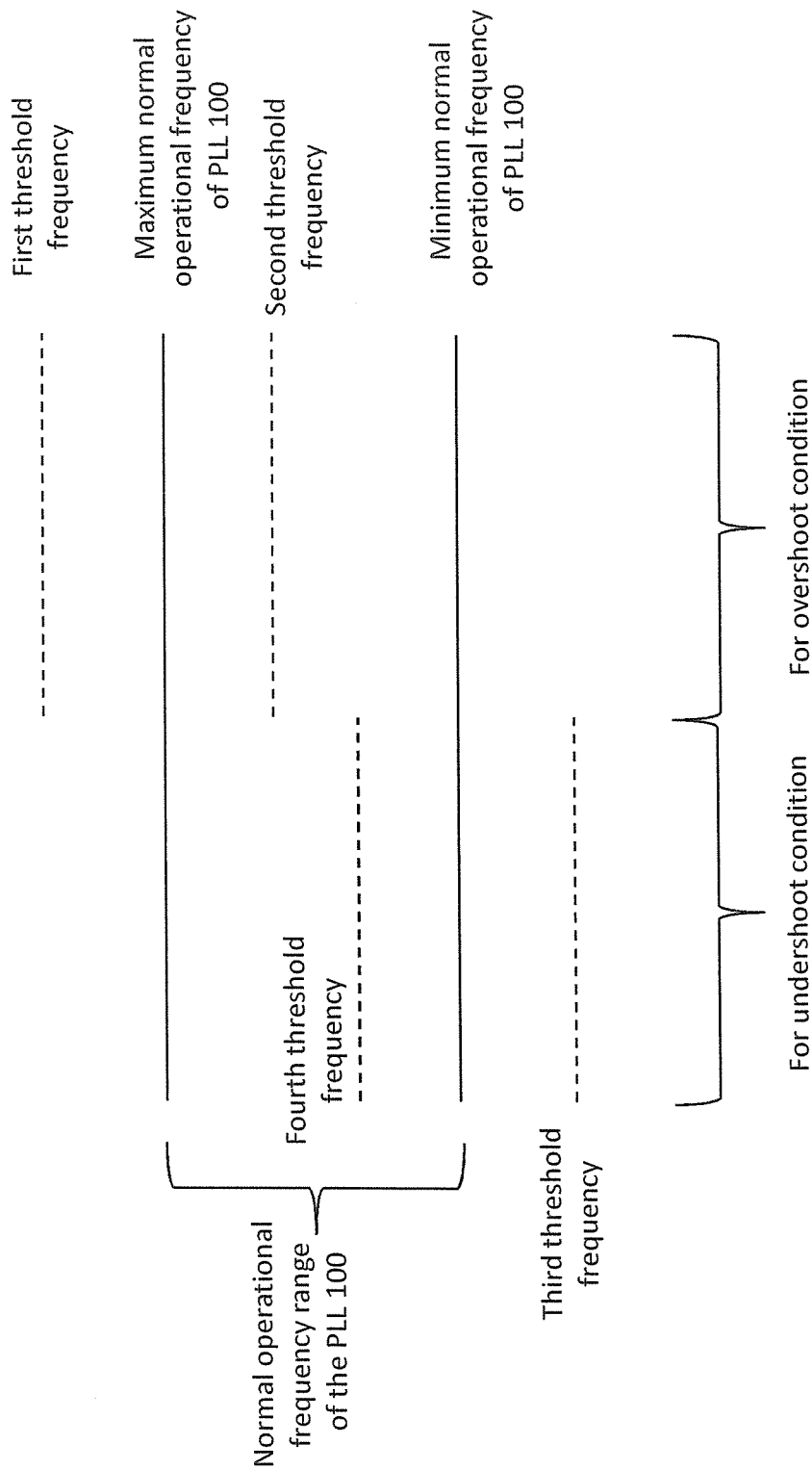
FIG. 4 is a diagram illustrating a relation of threshold frequencies for undershoot and overshoot conditions for the PLL of FIG. 1 with the normal operational frequency range of the PLL of FIG. 1 in accordance with an embodiment of the present invention.

Referring now to FIG. 4, a diagram illustrating the relation of the first through fourth threshold frequencies with the normal operational frequency range of the PLL 100 in accordance with an embodiment of the present invention is shown. The first threshold frequency is greater than the maximum normal operational frequency of the PLL 100. The third threshold frequency is less than the minimum normal operational frequency of the PLL 100. The second and fourth threshold frequencies lie within the normal operational frequency range of the PLL 100. In one embodiment, the second threshold frequency is greater than the fourth threshold frequency. In another embodiment, the second threshold frequency is less than the fourth threshold frequency.

Figure 5:
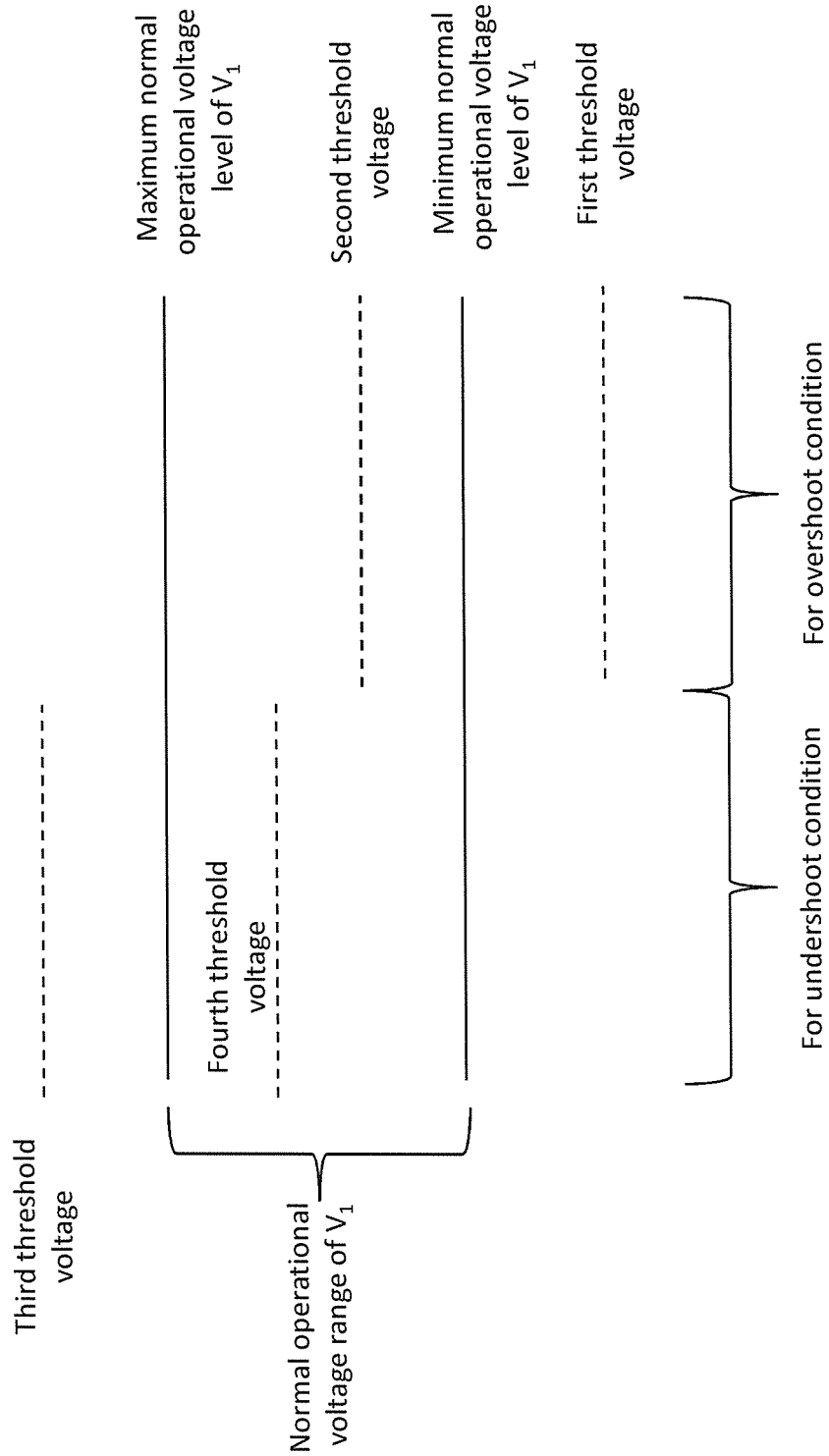
FIG. 5 is a diagram illustrating a relation of threshold voltages for undershoot and overshoot conditions for the PLL of FIG. 1 with the normal operational voltage range of an output of a loop filter of the PLL of FIG. 1 in accordance with an embodiment of the present invention.

Referring now to FIG. 5, a diagram illustrating the relation of the first through fourth threshold voltages with the normal operational voltage range of the first voltage ($V_1$) in accordance with an embodiment of the present invention is shown. The first threshold voltage is less than the minimum normal operational voltage level of the first voltage ($V_1$), and the third threshold voltage is greater than the maximum normal operational voltage level of the first voltage ($V_1$). The second and the fourth threshold voltages are within the normal operational voltage range of the first voltage ($V_1$).

In operation, the first switch 222 is in the closed position and the second switch 226 is in the open position when the frequency of the oscillating signal ($V_{OSC}$) is within the normal operational frequency range of the PLL 100. Thus, the first threshold voltage is output as the first reference voltage ($V_{REF\_1}$) from the third node $N_3$ and the third threshold voltage is output as the second reference voltage ($V_{REF\_2}$) from the fourth node $N_4$.

During an overshoot condition, when the frequency of the oscillating signal ($V_{OSC}$) exceeds the first threshold frequency (i.e., when the first voltage ($V_1$) becomes less than the first threshold voltage), the first comparator 206 activates the first control signal ($V_{CTRL\_1}$), which causes the up signal ($V_{UP}$) to be in the inactive state irrespective of the state of the intermediate up signal ($V_{INT\_UP}$), and the down signal ($V_{DOWN}$) to be in the active state irrespective of the state of the intermediate down signal ($V_{INT\_DOWN}$). Activation of the down signal ($V_{DOWN}$) results in discharging of the loop filter 106 (i.e., an increase in the first voltage ($V_1$)) which leads to a decrease in the frequency of the oscillating signal ($V_{OSC}$). Further, activation of the first control signal ($V_{CTRL\_1}$) causes the first switch 222 to be in the open position, thereby reducing the current through the first reference voltage generator 204. Thus, the second threshold voltage is output at the third node $N_3$. When the frequency of the oscillating signal ($V_{OSC}$) becomes less than the second threshold frequency, (i.e., when the first voltage ($V_1$) becomes greater than the second threshold voltage), the first comparator 206 deactivates the first control signal ($V_{CTRL\_1}$).

During an undershoot condition, when the frequency of the oscillating signal ($V_{OSC}$) becomes less than the third threshold frequency (i.e., when the first voltage ($V_1$) becomes greater than the third threshold voltage), the second comparator 210 activates the second control signal ($V_{CTRL\_2}$) which causes the down signal ($V_{DOWN}$) to be in the inactive state irrespective of the state of the intermediate down signal ($V_{INT\_DOWN}$), and the up signal ($V_{UP}$) to be in the active state irrespective of the state of the intermediate up signal ($V_{INT\_UP}$). Activation of the up signal ($V_{UP}$) leads to charging of the loop filter 106 (i.e., a decrease in the first voltage ($V_1$)), which leads to an increase in the frequency of the oscillating signal ($V_{OSC}$). Further, activation of the second control signal ($V_{CTRL\_2}$) causes the second switch 226 to be in the closed position, thereby increasing the current through the second reference voltage generator 208. Thus, the fourth threshold voltage is output at the fourth node $N_4$. When the frequency of the oscillating signal ($V_{OSC}$) becomes greater than the fourth threshold frequency, (i.e., when the first voltage ($V_1$) becomes less than the fourth threshold voltage), the second comparator 210 deactivates the second control signal ($V_{CTRL\_2}$).

Thus, during undershoot and overshoot conditions, the frequency bounding circuit 108 forces the PFD 102 to activate the up and down signals ($V_{UP}$ and $V_{DOWN}$), using the first and second control signals ($V_{CTRL\_1}$ and $V_{CTRL\_2}$), and thereby modulates the charge pump output current ($I_{OUTPUT}$) and hence, the first and second voltages ($V_1$ and $V_2$). The same charge pump (the charge pump 104), which is used to charge and discharge the loop filter 106 when there is no overshoot or undershoot in the frequency of the oscillating signal ($V_{OSC}$) (i.e., during the normal operation of the PLL 100), is also used to charge and discharge the loop filter 106 during the undershoot and overshoot conditions. Thus, no additional circuitry to be controlled by the frequency bounding circuit 108 is required to charge and discharge the loop filter 106 during the undershoot and overshoot conditions, thereby preventing additional leakage on the first and second nodes $N_1$ and $N_2$, and hence, the performance of the PLL 100 is not affected negatively.

The frequency bounding circuit 108 restores the normal operation of the PLL 100, even if components such as the loop divider 112 and the PFD 102 fail or malfunction. Comparison of the first voltage ($V_1$) with the first and second reference voltages ($V_{REF\_1}$ and $V_{REF\_2}$) is equivalent to the comparison of the control current ($I_{CCO}$) with reference currents. This ensures reduced variation across PVT corners as compared to comparing the first voltage ($V_1$) directly with a fixed threshold voltage, since for a fixed control current ($I_{CCO}$), variation in the frequency of the oscillating signal ($V_{OSC}$) due to PVT variations is low. Further, the first voltage ($V_1$), which is the filtered version of the second voltage ($V_2$), is used for comparison with the first and second reference voltages ($V_{REF\_1}$ and $V_{REF\_2}$) instead of the second voltage ($V_2$) to avoid spurious switching of the frequency bounding circuit 108.

It will be understood by those with skill in the art that the invention is not restricted to the use of the loop divider 112 in the PLL 100, but can also be used in PLLs that do not include a loop divider 112. In such PLLs, the PFD 102 receives the oscillating signal ($V_{OSC}$) as the feedback signal ($V_{FEEDBACK}$).

In one embodiment, the PLL 100 is an adaptive bandwidth PLL with the charge pump 104 receiving the first voltage ($V_1$) from the loop filter 106 and with the charge pump output current ($I_{OUTPUT}$) being proportional to the first voltage ($V_1$). In this embodiment, the charge pump 104 is designed such that it outputs the charge pump output current ($I_{OUTPUT}$) at a predefined value when the second control signal ($V_{CTRL\_2}$) is active. This reduces the time required to charge the loop filter 106 to a voltage that corresponds to a frequency of the oscillating signal ($V_{OSC}$) within the normal operational frequency range of the PLL 100 (i.e., the time required to restore the normal operation of the PLL 100 is reduced). Further, the frequency bounding circuit 108 considers the start-up condition of the PLL 100 to be similar to the undershoot condition. This reduces the start-up time of the PLL 100. During the start-up condition of the adaptive bandwidth PLL 100, the first voltage ($V_1$) is approximately equal to the supply voltage ($V_{DD}$).

It will be understood by those with skill in the art that the logic circuit 304 can also be implemented using multiplexers. Further, if the PLL 100 is implemented such that the frequency of the oscillating signal ($V_{OSC}$) increases with an increase in the second voltage ($V_2$), the connection to the positive terminal of the first comparator 206 is interchanged with the connection of the negative terminal of the first comparator 206, the connection to the positive terminal of the second comparator 210 is interchanged with the connection of the negative terminal of the second comparator 210, the current generation arm of the voltage-to-current converter 120 is implemented by using NMOS transistors, the first and second reference voltage generators 204 and 208 are implemented by using NMOS transistors and are connected to ground instead of the supply voltage ($V_{DD}$), and the current mirror 202 is implemented by using PMOS transistors and is connected to the supply voltage ($V_{DD}$).

Figure 6A:
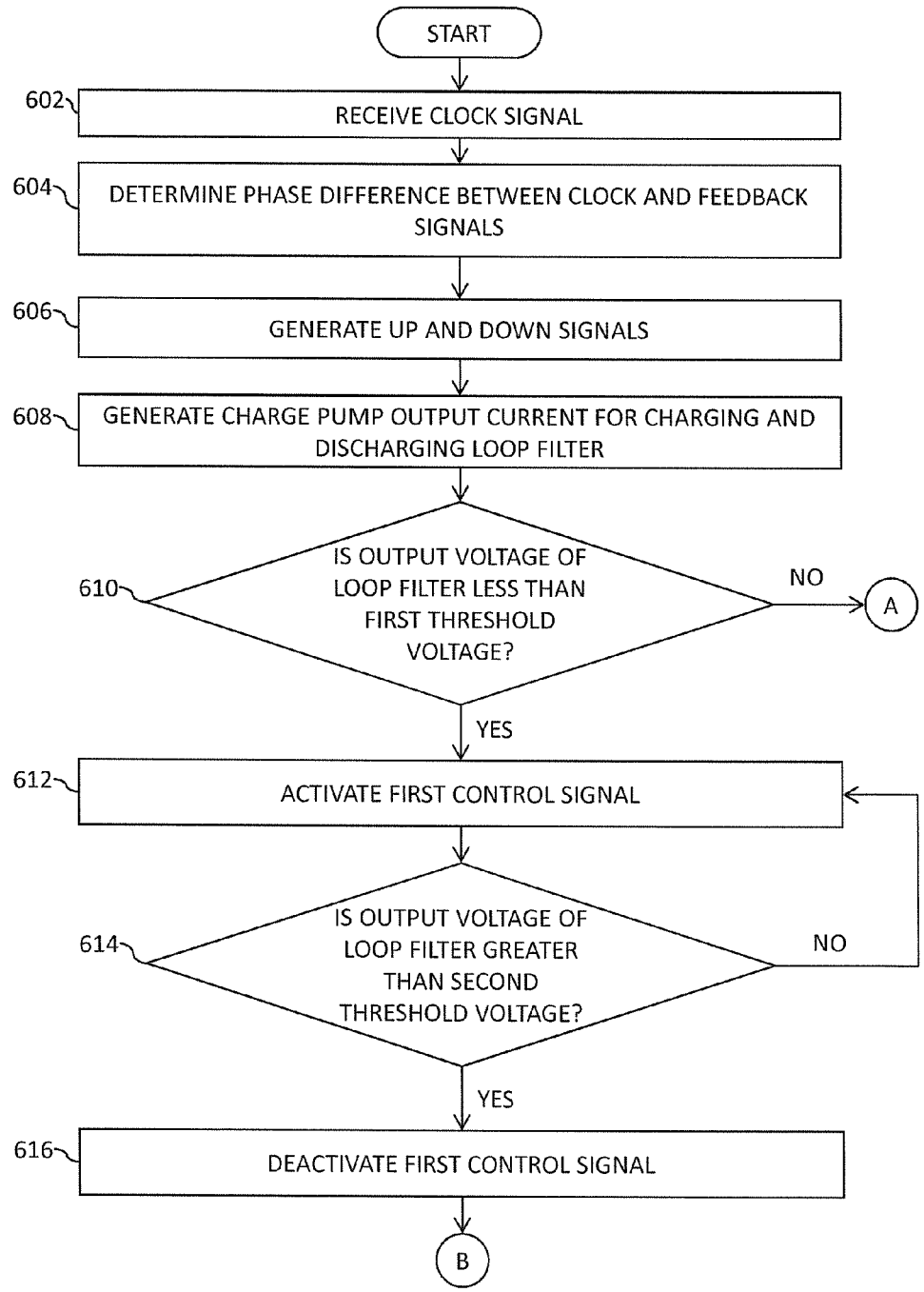
FIGS. 6A-6C are a flow chart illustrating a method for controlling a frequency of an output signal of the PLL of FIG. 1 in accordance with an embodiment of the present invention.
Figure 6B:
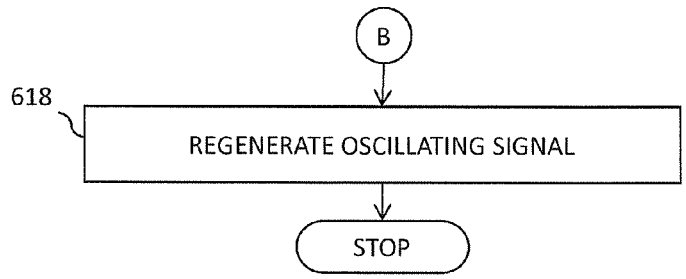
Figure 6C:
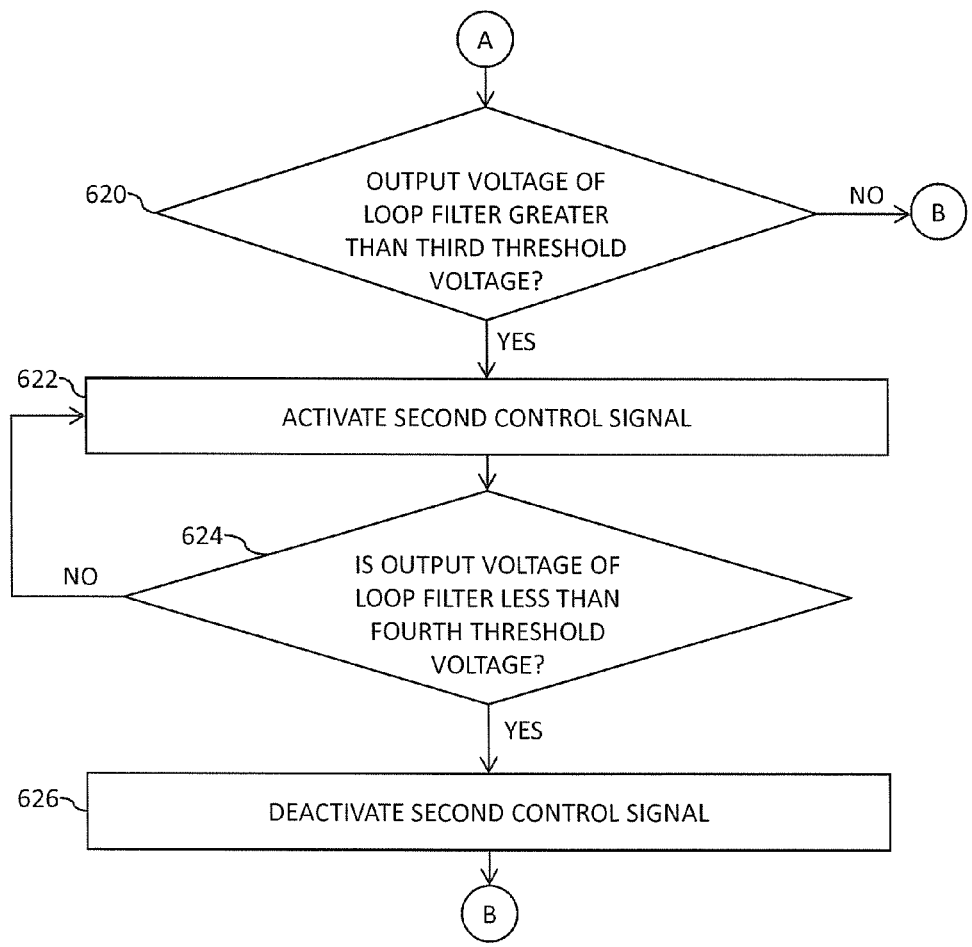

Referring now to FIGS. 6A-6C, a flow chart illustrating a method for controlling the frequency of the oscillating signal ($V_{OSC}$) in accordance with an embodiment of the present invention is shown. At step 602, the PFD 102 receives a clock signal ($V_{CLOCK}$). At step 604, the PFD 102 determines the phase difference between the clock signal ($V_{CLOCK}$) and the feedback signal ($V_{FEEDBACK}$). At step 606, the PFD 102 generates the up and down signals ($V_{UP}$ and $V_{DOWN}$). At step 608, the charge pump 104 generates the charge pump output current ($I_{OUTPUT}$) based on the up and down signals ($V_{UP}$ and $V_{DOWN}$) for charging and discharging the loop filter 106. At step 610, the frequency bounding circuit 108 determines whether an output voltage of the loop filter 106 (i.e., the first voltage ($V_1$)) is less than the first threshold voltage. If, at step 610, the frequency bounding circuit 108 determines that the output voltage of the loop filter 106 is less than the first threshold voltage, the frequency bounding circuit 108 executes step 612. At step 612, the frequency bounding circuit 108 activates the first control signal ($V_{CTRL\_1}$). At step 614, the frequency bounding circuit 108 determines whether the output voltage of the loop filter 106 is greater than the second threshold voltage. If, at step 614, the frequency bounding circuit 108 determines that the output voltage of the loop filter 106 is less than the second threshold voltage, the frequency bounding circuit 108 executes step 612. At step 616, the frequency bounding circuit 108 deactivates the first control signal ($V_{CTRL\_1}$). At step 618, the VCO 110 regenerates the oscillating signal ($V_{OSC}$).

If, at step 610, the frequency bounding circuit 108 determines that the output voltage of the loop filter 106 is greater than the first threshold voltage, the frequency bounding circuit 108 executes step 620. At step 620, the frequency bounding circuit 108 determines whether the output voltage of the loop filter 106 is greater than the third threshold voltage. If, at step 620, the frequency bounding circuit 108 determines that the output voltage of the loop filter 106 is less than the third threshold voltage, then step 618 is executed. At step 622, the frequency bounding circuit 108 activates the second control signal ($V_{CTRL\_2}$). At step 624, the frequency bounding circuit 108 determines whether the output voltage of the loop filter 106 is less than the fourth threshold voltage. If, at step 624, the frequency bounding circuit 108 determines that the output voltage of the loop filter 106 is greater than the fourth threshold voltage, the frequency bounding circuit 108 executes step 622. At step 626, the frequency bounding circuit 108 deactivates the second control signal ($V_{CTRL\_2}$), and then step 618 is executed.

It will be further understood by those with skill in the art that the same logical function may be performed by different arrangements of logic gates, or that logic circuits operate using either positive or negative logic signals. Therefore, variations in the arrangement of some of the logic gates described above should not be considered to depart from the scope of the present invention.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A phase-locked loop (PLL) for generating an oscillating signal, comprising:
   a phase-frequency detection circuit that receives a clock signal, a feedback signal, and first and second control signals, and generates up and down signals, wherein the down signal is activated when the first control signal is active and the up signal is activated when the second control signal is active;
   a charge pump, connected to the phase-frequency detection circuit, that receives the up and down signals and generates a charge pump output current;
   a loop filter, connected to the charge pump, that receives the charge pump output current and generates first and second voltages;
   a frequency bounding circuit that receives a reference current, and is connected to the loop filter for receiving the first voltage, and generates the first and second control signals, wherein the frequency bounding circuit (i) activates the first control signal when the first voltage is less than a first threshold voltage, (ii) deactivates the first control signal when the first voltage is greater than a second threshold voltage, (iii) activates the second control signal when the first voltage is greater than a third threshold voltage, and (iv) deactivates the second control signal when the first voltage is less than a fourth threshold voltage; and
   a voltage-controlled oscillator (VCO), connected to the loop filter, that receives the second voltage and generates the oscillating signal, wherein the feedback signal is at least one of the oscillating signal and a frequency-divided version of the oscillating signal.

2. The PLL of claim 1, wherein:
   the charge pump is further connected to the frequency bounding circuit for receiving the second control signal, and
   the charge pump outputs the charge pump output current at a predefined value when the second control signal is active.

3. The PLL of claim 1, wherein the first voltage is a filtered version of the second voltage.

4. The PLL of claim 1, wherein the first threshold voltage is less than the second threshold voltage, and the fourth threshold voltage is less than the third threshold voltage.

5. The PLL of claim 1, wherein the frequency bounding circuit comprises:
   a current mirror having an input branch that receives the reference current, and first and second output branches that output first and second sink currents, respectively;
   a first reference voltage generator connected to the first output branch of the current mirror to receive the first sink current and to the second output branch of the current mirror by way of a first switch to receive the second sink current, wherein a first reference voltage is output from a first node at a connection of the first output branch, the first switch, and the first reference voltage generator, and wherein the first threshold voltage is output as the first reference voltage from the first node when the first control signal is inactive, and the second threshold voltage is output as the first reference voltage from the first node when the first control signal is active, and wherein the first switch is controlled by the first control signal and is in an open position when the first control signal is active; and
   a first comparator, connected to the loop filter and the first reference voltage generator, that compares the first voltage with the first reference voltage and generates the first control signal.

6. The PLL of claim 5, wherein the current mirror comprises third and fourth output branches that output third and fourth sink currents, respectively, and wherein the frequency bounding circuit further comprises:
   a second reference voltage generator connected to the third output branch to receive the third sink current and to the fourth output branch by way of a second switch to receive the fourth sink current, wherein a second reference voltage is output from a second node formed by an interconnection of the second switch, the third output branch, and the second reference voltage generator, and wherein the third threshold voltage is output as the second reference voltage from the second node when the second control signal is inactive, and the fourth threshold voltage is output as the second reference voltage from the second node when the second control signal is active, and wherein the second switch is controlled by the second control signal and is in a closed position when the second control signal is active; and
   a second comparator, connected to the loop filter and the second reference voltage generator, that compares the first voltage with the second reference voltage and generates the second control signal.

7. The PLL of claim 1, wherein the phase-frequency detection circuit comprises:
  a phase-frequency detector that receives the clock signal and the feedback signal, and generates intermediate up and down signals; and
  a logic circuit, connected to the phase-frequency detector and the frequency bounding circuit, that receives the intermediate up and down signals, and the first and second control signals, and outputs at least one of the intermediate up and second control signals as the up signal, and at least one of the intermediate down and first control signals as the down signal.

8. The PLL of claim 7, wherein the logic circuit comprises:
  a first OR gate that receives the first and second control signals, and generates a first intermediate signal;
  a first AND gate that receives the first control signal and the first intermediate signal, and generates a second intermediate signal;
  a second AND gate that receives the second control signal and the first intermediate signal, and generates a third intermediate signal;
  a third AND gate that receives the intermediate up signal and an inverted version of the first intermediate signal, and generates a fourth intermediate signal;
  a fourth AND gate that receives the intermediate down signal and the inverted version of the first intermediate signal, and generates a fifth intermediate signal;
  a second OR gate that receives the third and fourth intermediate signals, and generates the up signal; and
  a third OR gate that receives the second and fifth intermediate signals, and generates the down signal.

9. A phase-locked loop (PLL) for generating an oscillating signal, comprising:
  a phase-frequency detection circuit that receives a clock signal, a feedback signal, and first and second control signals, and generates up and down signals, wherein the phase-frequency detection circuit activates the down signal when the first control signal is active and activates the up signal when the second control signal is active;
  a charge pump, connected to the phase-frequency detection circuit, that receives the up and down signals and generates a charge pump output current;
  a loop filter, connected to the charge pump, that receives the charge pump output current and generates first and second voltages;
  a frequency bounding circuit, comprising:
    a current mirror having an input branch that receives a reference current, and first through fourth output branches that output first through fourth sink currents, respectively;
    a first reference voltage generator connected to the first output branch to receive the first sink current and to the second output branch by way of a first switch to receive the second sink current, wherein a first reference voltage is output from a first node formed by an interconnection of the first output branch, the first switch, and the first reference voltage generator, and wherein a first threshold voltage is output as the first reference voltage from the first node when the first control signal is inactive, and a second threshold voltage is output as the first reference voltage from the first node when the first control signal is active, and wherein the first switch is controlled by the first control signal and is in an open position when the first control signal is active;
    a second reference voltage generator connected to the third output branch to receive the third sink current and to the fourth output branch by way of a second switch to receive the fourth sink current, wherein a second reference voltage is output from a second node formed by an interconnection of the second switch, the third output branch, and the second reference voltage generator, and wherein a third threshold voltage is output as the second reference voltage from the second node when the second control signal is inactive, and a fourth threshold voltage is output as the second reference voltage from the second node when the second control signal is active, and wherein the second switch is controlled by the second control signal and is in a closed position when the second control signal is active;
    a first comparator, connected to the loop filter and the first reference voltage generator, that compares the first voltage with the first reference voltage and generates the first control signal, wherein the first comparator activates the first control signal when the first voltage is less than the first threshold voltage and deactivates the first control signal when the first voltage is greater than the second threshold voltage; and
    a second comparator, connected to the loop filter and the second reference voltage generator, that compares the first voltage with the second reference voltage, and generates the second control signal, wherein the second comparator activates the second control signal when the first voltage is greater than the third threshold voltage, and deactivates the second control signal when the first voltage is less than the fourth threshold voltage; and
  a voltage-controlled oscillator (VCO), connected to the loop filter, that receives the second voltage and generates the oscillating signal, wherein the feedback signal is at least one of the oscillating signal and a frequency-divided version of the oscillating signal.

10. The PLL of claim 9, wherein the charge pump is further connected to the frequency bounding circuit for receiving the second control signal, and wherein the charge pump outputs the charge pump output current at a predefined value when the second control signal is active.

11. The PLL of claim 9, wherein the first voltage is a filtered version of the second voltage.

12. The PLL of claim 9, wherein the first threshold voltage is less than the second threshold voltage, and the fourth threshold voltage is less than the third threshold voltage.

13. The PLL of claim 9, wherein the phase-frequency detection circuit comprises:
  a phase-frequency detector that receives the clock signal and the feedback signal, and generates intermediate up and down signals; and
  a logic circuit, connected to the phase-frequency detector and the frequency bounding circuit, that receives the intermediate up and down signals, and the first and second control signals, and outputs at least one of the intermediate up and second control signals as the up signal, and at least one of the intermediate down and first control signals as the down signal.

14. The PLL of claim 13, wherein the logic circuit comprises:
  a first OR gate that receives the first and second control signals, and generates a first intermediate signal;

a first AND gate that receives the first control signal and the first intermediate signal, and generates a second intermediate signal;

a second AND gate that receives the second control signal and the first intermediate signal, and generates a third intermediate signal;

a third AND gate that receives the intermediate up signal and an inverted version of the first intermediate signal, and generates a fourth intermediate signal;

a fourth AND gate that receives the intermediate down signal and the inverted version of the first intermediate signal, and generates a fifth intermediate signal;

a second OR gate that receives the third and fourth intermediate signals, and generates the up signal; and a third OR gate that receives the second and fifth intermediate signals, and generates the down signal.

15. A method for controlling a frequency of an output oscillating signal of a phase-locked loop, the method comprising:

receiving a clock signal;

determining a phase difference between the clock signal and a feedback signal, wherein the feedback signal is at least one of the output oscillating signal and a frequency-divided version of the output oscillating signal;

generating up and down signals based on at least one of first and second control signals, and the phase difference between the clock signal and the feedback signal, wherein the down signal is active when the first control signal is active and the up signal is active when the second control signal is active;

generating a charge pump output current based on the up and down signals for charging and discharging a loop filter; and modulating the charge pump output current to control the frequency of the output oscillating signal, wherein modulating the charge pump output current comprises:

activating the first control signal when an output voltage of the loop filter is less than a first threshold voltage;

deactivating the first control signal when the output voltage of the loop filter is greater than a second threshold voltage;

activating the second control signal when the output voltage of the loop filter is greater than a third threshold voltage; and deactivating the second control signal when the output voltage of the loop filter is less than a fourth threshold voltage.

16. The method of claim 15, wherein the first threshold voltage is less than the second threshold voltage, and the fourth threshold voltage is less than the third threshold voltage.

17. The method of claim 15, wherein the charge pump output current is generated at a predefined value when the second control signal is active.

\* \* \* \* \*